United States Patent
Behrens

(10) Patent No.: US 7,204,057 B2
(45) Date of Patent: Apr. 17, 2007

(54) HF-REDUCING GREEN ROOFING

(76) Inventor: Wolfgang Behrens, Trespenmoor 1, D-27243 Gross Ippener (DE)

( * ) Notice: Subject to any disclaimer, the term of this patent is extended or adjusted under 35 U.S.C. 154(b) by 173 days.

(21) Appl. No.: 10/398,009

(22) PCT Filed: Sep. 3, 2002

(86) PCT No.: PCT/DE02/03267

§ 371 (c)(1),
(2), (4) Date: Apr. 1, 2003

(87) PCT Pub. No.: WO03/021055

PCT Pub. Date: Mar. 13, 2003

(65) Prior Publication Data

US 2004/0074164 A1    Apr. 22, 2004

(30) Foreign Application Priority Data

Sep. 5, 2001    (DE) ................. 101 43 655

(51) Int. Cl.
*A01G 9/02*     (2006.01)
*E04B 1/92*     (2006.01)

(52) U.S. Cl. ............... 47/65.9; 47/65.7; 47/56; 342/4

(58) Field of Classification Search ......... 47/65.9, 47/56, 65.7; 342/4
See application file for complete search history.

(56) References Cited

U.S. PATENT DOCUMENTS

| | | | | |
|---|---|---|---|---|
| 2,113,523 A | * | 4/1938 | Hart | 47/33 |
| 2,121,173 A | * | 6/1938 | MacPherson | 47/33 |
| 5,390,442 A | * | 2/1995 | Behrens | 47/59 R |
| 5,788,110 A | * | 8/1998 | Alhamad | 342/4 |
| 2003/0044242 A1 | * | 3/2003 | Chen | 405/302.6 |

FOREIGN PATENT DOCUMENTS

| | | | |
|---|---|---|---|
| DE | 3244703 A1 | * | 6/1984 |
| DE | 197 05 180 | | 8/1998 |
| EP | 1 096 077 | | 5/2001 |
| JP | 2003189744 A | * | 7/2003 |

OTHER PUBLICATIONS

Universität Kassel, (2001) "Gründächer und Lehmgewölbe bieten idealen Schutz gegen elektromagnetische Wellen", *Pressemitteilung*.

* cited by examiner

*Primary Examiner*—Jeffrey L. Gellner
(74) *Attorney, Agent, or Firm*—Collard & Roe, P.C.

(57) ABSTRACT

The invention describes a HF-reducing green roof. This green roof comprises a support construction consisting of a layer of textile fibers and/or a substrate (12), a vegetation layer (14) of low plants, and a flat or three-dimensional structure of electrically conductive filaments. This structure supplements the support construction or forms part thereof. The intermediate spaces between adjacent electrically conductive filaments (10) are smaller than one quarter of the wavelength of the electromagnetic HF-radiation to be shielded.

20 Claims, 3 Drawing Sheets

HF-REDUCING GREEN ROOFING

CROSS REFERENCE TO RELATED APPLICATIONS

Applicant claims priority under 35 U.S.C. §119 of German Application No. 101 43 655.6, filed Sep. 5, 2001. Applicant also claims priority under 35 U.S.C. §365 of PCT/DE02/03267, filed Sep. 3, 2002. The international application under PCT article 21(2) was not published in English.

The invention pertains to a HF-reducing green roof according to the preamble of claim 1.

During the expansion phase of mobile radiotelephone networks, the number of base stations is increased so as to provide an adequate coverage area and a high call capacity. A high density of the base stations is, in principle, sensible for the users of mobile radiotelephones because the radiotelephone can, according to mobile radiotelephone specifications, only transmit with the transmitting power required for a flawless connection. This means that the transmitting power of the mobile radiotelephone is automatically reduced when its distance from the base station is relatively short. This also lowers the radiation exposure for the user of the mobile radiotelephone.

It would also be sensible to provide shielding measures for reducing the high-frequency electromagnetic radiation emitted by the base stations within buildings. In light of the facts that the radiation exposure increases as the distance from the transmitting antenna decreases and that the antennas are always arranged at an elevation that lies above buildings, the roofs of buildings appear to be particularly effective locations for these shielding measures.

In a study published by the Universität Gesamthochschule Kassel in June, 2001 in press release 60/01, it was determined that clay barrel vaults with a grass roof have excellent attenuation properties for the relevant frequency range of the mobile radiotelephone network. In this case, the attenuation effect improves as the frequency increases.

This study also provides information on that a clay barrel vault with a grass roof and a lightweight substrate with a thickness of approximately 15 cm makes it possible to achieve a transmission attenuation of approximately 49 dB. A grass roof as such still provides a radiation attenuation of approximately 22 dB. However, a conventional tile roof only provides a radiation attenuation of approximately 3 dB. The study does not make it possible to conclude whether the attenuation properties for high-frequency electromagnetic radiation which were determined for a clay vault with a grass roof also apply to a green roof comprising a support construction and/or a substrate, on which a vegetation layer of low plants is arranged.

The invention is based on the objective of developing a green roof with a layer of textile fibers and/or a substrate, on which a vegetation layer of low plants is arranged, wherein said green roof has superior properties with respect to the absorption of high-frequency electromagnetic radiation.

This objective is attained with the characteristics of claim 1.

The shielding effect of the electrically conductive filaments is achieved due to the fact that part of the electromagnetic radiation is reflected and another part of the electromagnetic radiation is absorbed by eddy current losses. Since the intermediate spaces are small in comparison with the wavelength of the electromagnetic radiation, only a small part of the electromagnetic radiation is transmitted through the flat or three-dimensional structure of electrically conductive filaments. In this case, the function of the support construction as a support for the vegetation layer is not impaired.

The layer of textile fibers and/or the substrate, as well as the vegetation layer of low plants, also contribute significantly to the HF reduction. The attenuation effect is greater than the sum of the individual attenuations of the flat or three-dimensional structure of electrically conductive filaments and the layer of textile fibers and/or the substrate, as well as the vegetation layer of low plants. The observed synergy is presumably based on the fact that the secondary radiation emitted by the electrically conductive filaments is partially absorbed by the directly adjacent layer of textile fibers and/or the substrate, as well as the vegetation layer of low plants.

The individual electrically conductive filaments preferably are also connected to one another in an electrically conductive fashion.

This results in a nearly continuous conductive surface area.

The structure of electrically conductive filaments may form an additional layer or be integrated into the support construction.

Depending on the design of the support construction, it is possible to combine the structure of electrically conductive filaments and the support construction without impairing the vegetation. When choosing such an integrated design, the structure of electrically conductive filaments may also replace or supplement individual components of the support construction and completely or partially replace the portion of fibers or threads of non-conductive material which was used so far for the same purpose. The portion of electrically non-conductive material used so far can be correspondingly reduced.

The structure of electrically conductive filaments may consist of a looped structure, a mat or even sewing material for connecting several layers of the support construction to one another.

The structure of electrically conductive filaments may be realized in the form of a screen, a woven structure, a knitted structure or a fleece.

The electrically conductive filaments may also have the shape of strips.

These designs simplify the integration of the structure of electrically conductive filaments into the support construction without impairing the vegetation layer.

Depending on the frequency range to be shielded, the distance between adjacent electrically conductive filaments preferably lies between the 0.5 mm and 10 mm.

If the distances between the electrically conductive filaments are chosen within this range, the flat or three-dimensional structure approximately acts like a continuous conductive layer referred to the wavelength of the electromagnetic radiation.

The material for the electrically conductive filaments or their coating may consist of metals such as silver, copper, tin, zinc, aluminum or nickel, metal alloys such as special steel or carbon fibers with a superior electric conductivity.

The electrically conductive filaments may also be provided with a surface coating.

It is preferred to either utilize metals or metal alloys that are non-toxic to the vegetation layer or metals or metal alloys with a neutral coating referred to the plants in order to prevent the release of ions, atoms, molecules or chemical compounds that could endanger the plant growth.

Other criteria in the selection of the metals or metal alloys and the coatings are inflammability and fire-retarding properties.

The invention is described in greater detail below with reference to embodiments of the support construction for green roofs.

The figures show:

FIG. 1 a section through a first embodiment of a green roof according to the invention, and FIG. 2 a section through a second embodiment of a green roof according to the invention.

Figure 1:
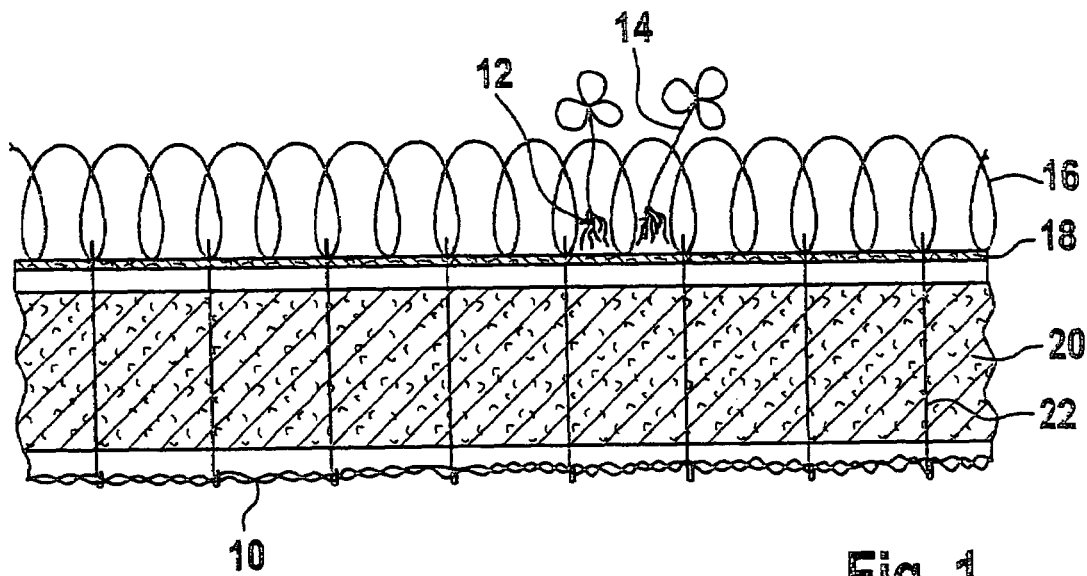

FIG. 1 shows a support construction for a green roof in the form of a support mat that can be pre-cultivated, wherein a bottom layer consists of a thick fleece 20 and a top layer consists of a looped fabric 16, the bottom of which is provided with a fleece lamination 18. The looped fabric 16 with the fleece lamination 18 is stitched to the thick fleece 20 by means of connecting threads 22. The looped fabric 16 serves for mechanically fixing a substrate layer 12 that accommodates the roots of a vegetation layer 14. A structure of electrically conductive filaments 10 may be arranged underneath, within or above the thick fleece layer 20.

It would also be possible to replace the fleece lamination 18 of the looped fabric 16 with the structure of electrically conductive filaments 10 or to produce the fleece lamination 18 of such filaments. It would also be conceivable to supplement or replace the looped fabric 16 with electrically conductive filaments 10. The connecting threads 22 could also be supplemented or replaced with the electrically conductive filaments 10.

If the structure of electrically conductive filaments 10 is integrated into or forms part of the support construction, the vegetation layer 14 is already pre-cultivated in this configuration. If the structure of electrically conductive filaments 10 is used in addition to and independently of the support mat, the installation of the structure may take place when the pre-cultivated support mat is installed at the construction site.

A similar integration is possible if the support mats with a thick fleece 20 are replaced with support mats, in which the fleece is replaced or supplemented with stitched coconut fiber mats, coconut fiber mats with a fleece or coconut fiber mats with mineral wool. This applies accordingly to support mats, in which a screen network is provided for reinforcing the growing roots. In this case, the structure of electrically conductive filaments 10 may supplement the screen network or replace the polyethylene fibers used so far for this purpose.

Figure 2:
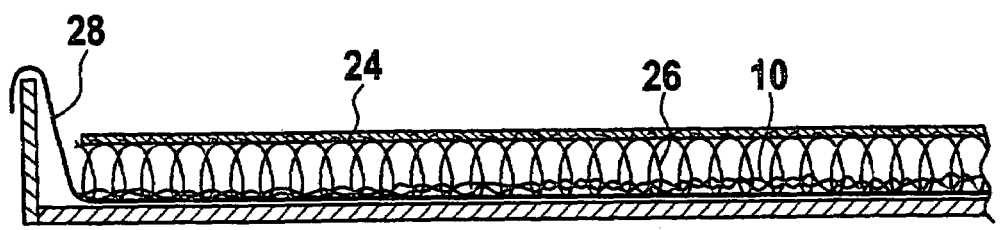
Figure 3:
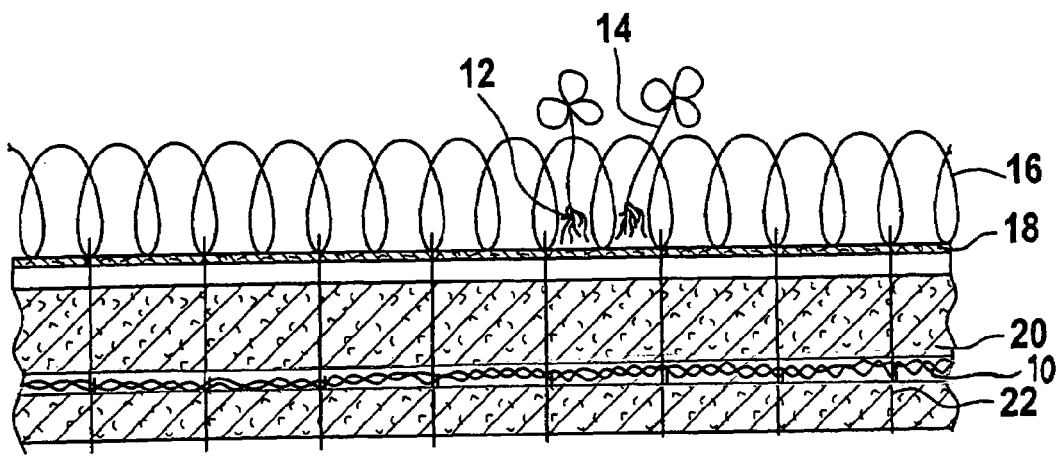
FIG. 3 shows a section through a vegetation element similar to FIG. 1 but with the additional layer of electrically conductive filaments disposed within the textile fiber layer.
Figure 4:
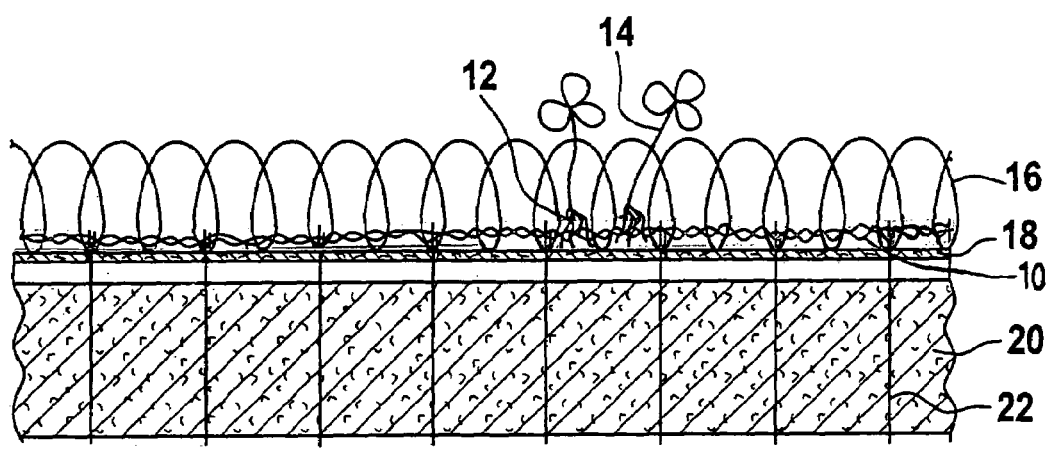
FIG. 4 shows a section through a vegetation element similar to FIG. 1 but with the additional layer of electrically conductive filaments disposed between the textile fiber layer and the vegetation layer.
Figure 5:
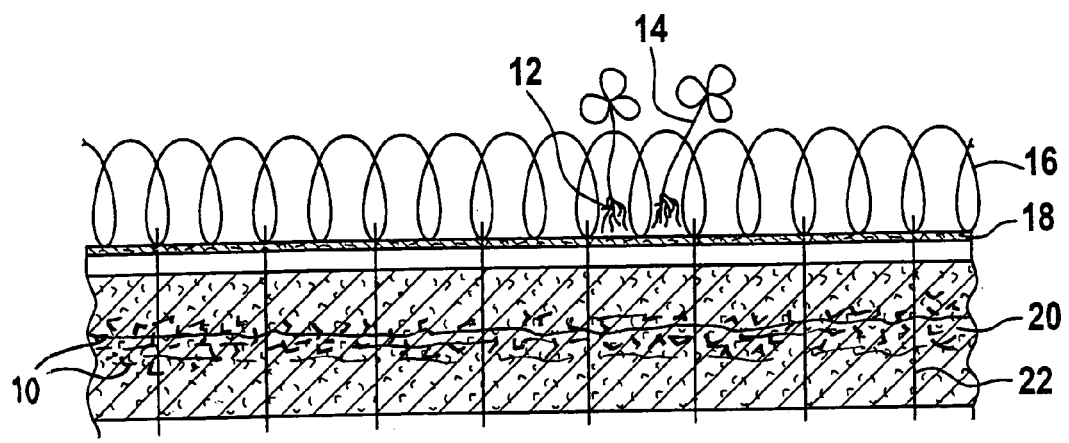
FIG. 5 shows a section through a vegetation element filament similar to FIG. 1 but with the electrically conductive filaments disposed within the textile fiber layer and partially forming the textile fiber layer.
Figure 6:
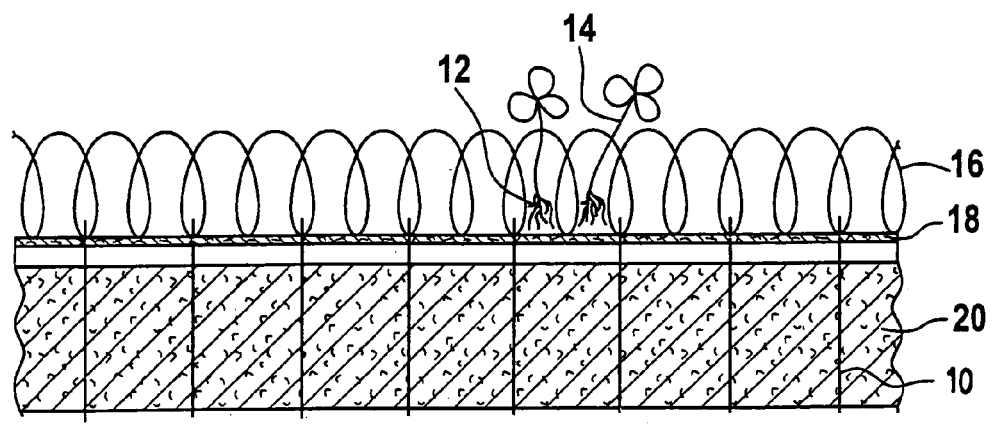
FIG. 6 shows a section through a vegetation element similar to FIG. 1 but with the electrically conductive filaments connecting several layers of the textile fiber layer with one another.

FIG. 2 shows the structure of a root-proof sealing layer that serves for protecting the water-tight roof covering 28 of a building. This sealing layer may be additionally installed underneath the support mat according to FIG. 1. The sealing layer may consist of a looped fabric 26 provided for drainage purposes and a layer of a protection and separation fleece 24 arranged above the looped fabric 26.

In this case, the structure of electrically conductive filaments 10 may be integrated into the looped fabric 26 or into the protection and separation fleece 24. Alternatively, the electrically conductive filaments may also replace other required threads of the fabric or the fleece.

If an additional layer consisting of hygroscopic mineral wool is provided, the structure of electrically conductive filaments 10 may be optionally arranged above, underneath or within this layer.

The invention claimed is:

1. A vegetation element disposed on a roof for reducing highfrequency radiation comprising:
    (a) a textile fiber layer forming a support;
    (b) a vegetation layer of low plants disposed on said textile fiber layer; and
    (c) a flat or three-dimensional structure of electrically conductive filaments disposed within and partially forming said textile fiber layer;
    wherein the intermediate spaces between adjacent electrically conductive filaments are smaller than one quarter of the wavelength of the electromagnetic high-frequency radiation to be shielded.

2. The vegetation element according to claim 1 further comprising a substrate layer disposed between said textile fiber layer and said vegetation layer.

3. The vegetation element according to claim 1 wherein the electrically conductive filaments are connected with one another.

4. The vegetation element according to claim 1, wherein the structure of electrically conductive filaments is a mat.

5. The vegetation element according to claim 1, wherein the structure of electrically conductive filaments forms a lattice, a woven structure, a knitted structure, or a nonwoven fabric.

6. The vegetation element according to claim 1, wherein the electrically conductive filaments are configured as strips.

7. The vegetation element according to claim 1, wherein the distance between adjacent filaments is between 0.5 mm and 10 mm.

8. The vegetation element according to claim 1, wherein the electrically conductive filaments are made from metals, metal alloys, or carbon fibers.

9. The vegetation element according to claim 8, wherein the electrically conductive filaments are made from silver, copper, tin, zinc, aluminum, nickel, or stainless steel.

10. The vegetation element according to claim 1, wherein the electrically conductive filaments are provided with a surface coating.

11. A vegetation element disposed on a roof for reducing high-frequency radiation comprising:
    (a) a textile fiber layer comprising a plurality of layers forming a support;
    (b) a vegetation layer of low plants disposed on said textile fiber layer; and
    (c) a flat or three-dimensional structure of electrically conductive filaments connecting at least some of the plurality of layers of the textile fiber layer with one another;
    wherein the intermediate spaces between adjacent electrically conductive filaments are smaller than one quarter of the wavelength of the electromagnetic high-frequency radiation to be shielded.

12. The vegetation element according to claim 11 further comprising a substrate layer disposed between said textile fiber layer and said vegetation layer.

13. The vegetation element according to claim 11 wherein the electrically conductive filaments are connected with one another.

14. The vegetation element according to claim 11, wherein the structure of electrically conductive filaments is a mat.

15. The vegetation element according to claim 11, wherein the structure of electrically conductive filaments forms a lattice, a woven structure, a knitted structure, or a non-woven fabric.

16. The vegetation element according to claim 11, wherein the electrically conductive filaments are configured as strips.

17. The vegetation element according to claim 11, wherein the distance between adjacent filaments is between 0.5 mm and 10 mm.

18. The vegetation element according to claim 11, wherein the electrically conductive filaments are made from metals, metal alloys, or carbon fibers.

19. The vegetation element according to claim 18, wherein the electrically conductive filaments are made from silver, copper, tin, zinc, aluminum, nickel, or stainless steel.

20. The vegetation element according to claim 11, wherein the electrically conductive filaments are provided with a surface coating.

* * * * *